(12) United States Patent
Alami-Idrissi et al.

(10) Patent No.: US 8,435,897 B2
(45) Date of Patent: May 7, 2013

(54) METHOD FOR RECLAIMING A SURFACE OF A SUBSTRATE

(75) Inventors: Aziz Alami-Idrissi, Le Touvet (FR);
Sebastien Kerdiles, Saint Ismier (FR);
Walter Schwarzenbach, Saint Nzaire les Eymes (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 178 days.

(21) Appl. No.: 12/658,655

(22) Filed: Feb. 12, 2010

(65) Prior Publication Data
US 2010/0200854 A1 Aug. 12, 2010

(30) Foreign Application Priority Data

Feb. 12, 2009 (EP) .................................. 09290104

(51) Int. Cl.
*H01L 29/72* (2006.01)
(52) U.S. Cl.
USPC .............. 438/690; 438/692; 438/694; 451/41
(58) Field of Classification Search .................. 438/690, 438/692, 694; 451/41
See application file for complete search history.

(56) References Cited

U.S. PATENT DOCUMENTS

| | | | | |
|---|---|---|---|---|
| 5,867,302 A | * | 2/1999 | Fleming | 359/291 |
| 2006/0121699 A1 | * | 6/2006 | Blomiley et al. | 438/478 |

FOREIGN PATENT DOCUMENTS

| | | |
|---|---|---|
| EP | 1156531 A1 | 11/2001 |
| EP | 1662560 A2 | 5/2006 |
| JP | 2005-072071 A | 3/2005 |
| WO | WO-00/25984 | 5/2000 |
| WO | WO-0025984 A1 | 5/2000 |

OTHER PUBLICATIONS

European Search Report for EP 09290104 dated Jun. 16, 2009 (5 pgs.).

* cited by examiner

*Primary Examiner* — Edward Wojciechowicz
(74) *Attorney, Agent, or Firm* — Edwards Wildman Palmer LLP; George W. Neuner; George N. Chaclas

(57) ABSTRACT

A method for reclaiming a surface of a substrate, wherein the surface, in particular a silicon surface, comprises a protruding residual topography, comprising at least the layer of a first material. By providing a filling material in the non-protruding areas of the surface of the substrate and the subsequent polishing, the reclaiming can be carried out such that the material consuming double-sided polishing step used in the prior art is no longer necessary.

16 Claims, 3 Drawing Sheets

METHOD FOR RECLAIMING A SURFACE OF A SUBSTRATE

CROSS REFERENCE TO RELATED APPLICATION

This application claims priority to European Patent Application No. EP09290104, filed Feb. 12, 2009, which is incorporated herein by reference in its entirety.

BACKGROUND

1. Field of the Disclosure

The present disclosure relates to a method for reclaiming a surface of a substrate. In particular, the present disclosure relates to a method for reclaiming a surface of a silicon substrate that includes a protruding residual topography resulting from a layer transfer process typically comprising an ion implantation step, a bonding step and a detachment step.

2. Description of Related Art

The so-called Smart Cut™ process, illustrated in FIG. 1, provides high quality silicon on insulator (SOI) substrates. During this process, two substrates, called a handle substrate 101 and a donor substrate 103, usually a silicon wafer, undergo a certain number of process steps to transfer a layer with a given thickness of the donor substrate 103 onto the handle substrate 101. During the process, the donor substrate 103 is typically oxidized to form an oxidation layer 105, which later forms the buried oxide layer (BOX) of the SOI structure, and an ion implantation step is applied to form a predetermined splitting area 107 defining the layer that is to be transferred. Subsequently, the donor substrate 103 is attached to the handle substrate 101, in particular via bonding, taking advantage of Van der Waal's forces, to obtain a donor-handle compound 109. Using a mechanical and/or thermal treatment, a detachment of a semiconductor layer 111 together with the buried oxide layer 113 occurs at the predetermined splitting area 107 so that the two layers are transferred onto the handle substrate 101 to obtain the desired silicon on insulator structure 115.

The remaining part 117 of the donor substrate 101, also called the negative, can be recycled and again used in the Smart Cut™ type process as a new donor or handle substrate. This recycling aspect of the Smart Cut™ type SOI fabrication process provides a significant economic advantage when compared with other processes. Indeed, the process optimizes the use of raw materials such as silicon wafers.

As illustrated in FIG. 1, the negative 117 has a characteristic topography representing protruding residues 119a and 119b in an edge region, which corresponds to a region where no layer transfer occurred due to the shape of the edge of the initial wafers 103 and/or 101. The surface of the negative 117 between the protruding residues 119a and 119b has a first inner region 121 at which detachment occurred to provide the transferred layer 111 on the handle substrate 101 and which has a rather rough surface typically close to 60-70 angstrom (Å) RMS as measured by atomic force microscopy (AFM), which is to be compared to 1-3 Å for a standard silicon wafer. The edge of the negative 117 with the protruding residues 119a and 119b actually has a chamfered shape and furthermore comprises a step-like structure 123 seen from the internal region 121 comprising the remaining part of the buried oxide layer 125 and the non-transferred silicon 127 over the remaining part of the ion implanted predetermined splitting area 129. The edge 131 and the backside 133 of the negative 117 are also covered by the oxide.

The step-like structure 123 of the negative 117 typically has a thickness of about 1000-10000 Å of silicon, mostly between 2000 to 3000 Å, 100 to 10000 Å of silicon oxide and has a width w in the lateral direction on the order of 1-3 mm.

Prior to the reuse of the negative 117 as donor substrate 103 or handle substrate 101, the surface roughness of the inner region 121 needs to be reduced and the protruding residual topography 119a and 119b need to be removed. Methods to do so are, for example, known from EP 1 156 531 A1 and U.S. Pat. No. 7,402,520 B2. Typically, the following process is applied to get rid of the protruding residual topography: the reclaiming process starts with a de-oxidation step to remove the oxide layer 125 on top of the protruding residual topography on the edge of the negative 117 as well as on the side 131 and on its backside 133. The de-oxidation can, for example, be carried out using a hydrofluoric acid (HF) bath, wherein the acid consumes the oxide layer 125, 131 and 133. Subsequently, a first polishing step of the edge region of substrate 1 is carried out to at least partially remove the protruding silicon part 127 on the edge. Then a double-sided polishing (DSP) step is carried out to improve the surface roughness in the interior region 121 but also to further remove the step 123 in the direction of the protruding residual topography 119a and 119b. Finally, to obtain a suitable surface roughness on the front surface of the negative 117, a chemical mechanical polishing step (CMP) is carried out.

Even though it is possible to obtain a recycled substrate that can be reused in the Smart Cut™ process using the reclaiming process described above, this process includes a double-sided polishing step, which has the major disadvantage that, during polishing, up to 10 μm (5 μm on each side of the substrate) must be removed to get rid of the protruding residual topography 119a and 119b. Therefore, it is an object of the present disclosure to provide an improved reclaiming process that does not require the double-sided polishing step to reclaim the remainder of the donor substrate.

SUMMARY OF THE DISCLOSURE

Advantages of the present disclosure will be set forth in and become apparent from the description that follows. Additional advantages of the disclosure will be realized and attained by the methods and systems particularly pointed out in the written description and claims, as well as from the appended drawings.

To achieve these and other advantages, and in accordance with the purpose of the disclosure, as embodied herein, the disclosure includes an exemplary method for reclaiming the surface of a substrate that includes a protruding residual topography, in particular resulting from a layer transfer process, and comprising at least a layer of a first material like silicon. The exemplary method includes the steps of: a) providing a filling material, in particular silicon, in the non-protruding areas of the surface of the substrate, and b) polishing the surface, wherein the filling material and at least a part of the protruding residual topography are polished simultaneously during the polishing step b). By leveling out the protruding and non-protruding areas with a filling material, it becomes possible to get rid of the material consuming double-sided polishing step. As a result, the substrate can be reused a greater number of times.

The first material and the filling material can be chosen such that the polishing in step b) occurs substantially at the same removal rate. In this context, the filling material can be preferably chosen such that its mechanical and/or chemical polishing properties correspond to the properties of the first material. This optimizes the polishing step b). Preferably, the filling material and the first material are of the same chemical nature. With this method, it is possible to get rid of the double-sided polishing step.

The first material of the protruding residual topography can be in a monocrystalline phase and the filling material can be in a polycrystalline phase. With respect to polishing, it does not matter whether the material is in a monocrystalline or polycrystalline phase, one can take advantage of the faster deposition of a material deposited in polycrystalline phase compared to the growth of a crystalline phase. This renders the exemplary method even more effective.

Advantageously, step b) can comprise a chemical mechanical polishing (CMP) step. Instead of applying the DSP method with a total material removal of the order of 10 μm (5 μm on both sides), the exemplary method requires only a CMP polishing during which only up to 1 μm of material is removed. Due to this limited material removal, a donor substrate can be reused more often while remaining within Semiconductor Equipment and Materials International (SEMI) standards concerning material thickness and geometry.

Advantageously, the thickness of the layer with the filling material can be in a range of 50% to about 150% of the thickness of the first material of the protruding topology, in particular in a range of 80% to 120% of the thickness of the first material, even more in particular, can correspond to the thickness of the first material. In this range of filling material thicknesses, a standard polishing process (e.g. CMP) can be carried out to reclaim the surface of the substrate while, at the same time securing the geometry of the edge regions.

According to one exemplary embodiment, the protruding topography can comprise a second layer of a second material, in particular silicon dioxide, over the first layer of the protruding residual topography. In addition, step a) can comprise depositing, in particular in a reactor using one or more silicon precursors such as silane (SiH4), disilane (Si2H6), Si3H8, and the like, the filling material on the second material of the protruding topography and on the non-protruding areas, and removing the second layer to thereby, at the same time, remove the filling material over the protruding topography. In this embodiment, the second material can, for example, be an oxide, and thus plays the role of a physical mask. In fact, the filling material is deposited on all surfaces independent of whether it is of the second material (oxide) or the first material (silicon).

Advantageously, the substrate can be arranged such that, during the deposition step, the surface side opposite to the surface with the protruding topography remains without a layer of the filling material. This simplifies the removal of the second layer as it remains at least partially accessible to the removal agent.

According to a second exemplary embodiment, the protruding topography can comprise a second layer of a second material, in particular silicon oxide, over the first layer, wherein the filling material providing step can comprise depositing the filling material only on the non-protruding areas, using the second layer as a mask. Indeed, the filling material deposition can be selective, depending on the choice of the one or more precursors used in the reactor. For example, dichlorosilane (DSC: SiH2Cl2), TCS (SiHCl3), and SiCl4 can be used to obtain a selective deposition. In particular, deposition can be obtained on the non-protruding silicon area without deposition on the protruding regions covered by an oxide. In this case, the second layer on the protruding topography plays the role of a chemical mask, which due to its chemical properties prevents the deposition of the filling material on its surface. Advantageously, this variant can comprise an additional step of removing the second layer, thus the mask. The process according to this variant can be carried out as a batch process (concerning depositing of the filling material as well as the removal of the second layer) the backside of the substrate, thus the side opposite to where the protruding topography is present, does not play any particular role.

Advantageously, the second layer removal step can comprise a de-oxidation step using in particular an HF bath. In the first variant, this leads at the same time to the removal by lift-off of the filling material present on the protruding topography. By having prevented the deposition of the filling material on the backside, the HF bath can attack via the backside, which leads to the desired lift-off and removal of the oxide. In the second embodiment, the chemical mask that prevented filling material deposition on the protruding regions can effectively be removed.

Preferably, during step b) at least a thickness corresponding to the thickness of the first layer can be removed. Thus, the entire protruding topography is removed and a flat reclaimed surface obtained.

Advantageously, the material removal can go beyond the region with implantation defects. The substrate quality can thus be brought back to a suitable level so that the substrate can be reused, without having to remove as much material as during a double-sided polishing.

Preferably, the material removal can be in a range 2000-12,000 Å, in particular depending on the maximum height of the protruding topography being related to the ion implanting process where the energy of the ion defines the depth of implantation.

According to an exemplary embodiment, the method can further comprise an edge polishing step to remove an ion implanted region in the chamfered edge area of the substrate. This additional step helps to further improve the quality of the reclaimed substrate.

A substrate which comprises a base, an ion implanted region as well as a non-ion implanted region over the base, in particular in a edge region of the base, a first layer of a first material on the ion implanted region, and a filling layer of a filling material on the non-ion implanted region is also disclosed. Such a substrate can be easily recycled by applying a polishing step, in particular a CMP polishing step, to make it ready for reuse in a Smart Cut™ type application. The first material can be in a monocrystalline phase and the filling material can be in a polycrystalline phase. As already described above, by providing a polycrystalline filling layer, the desired structure can be rapidly achieved.

It is to be understood that the foregoing general description and the following detailed description are exemplary and are intended to provide further explanation of the disclosed embodiments.

The accompanying drawings, which are incorporated in and constitute part of this specification, are included to illustrate and provide a further understanding of the method and system of the disclosed embodiments. Together with the description, the drawings serve to explain principles of the disclosed embodiments.

DETAILED DESCRIPTION OF PREFERRED EMBODIMENTS

Reference will now be made in detail to the present preferred embodiments of the disclosure, examples of which are illustrated in the accompanying drawings.

Figure 1:
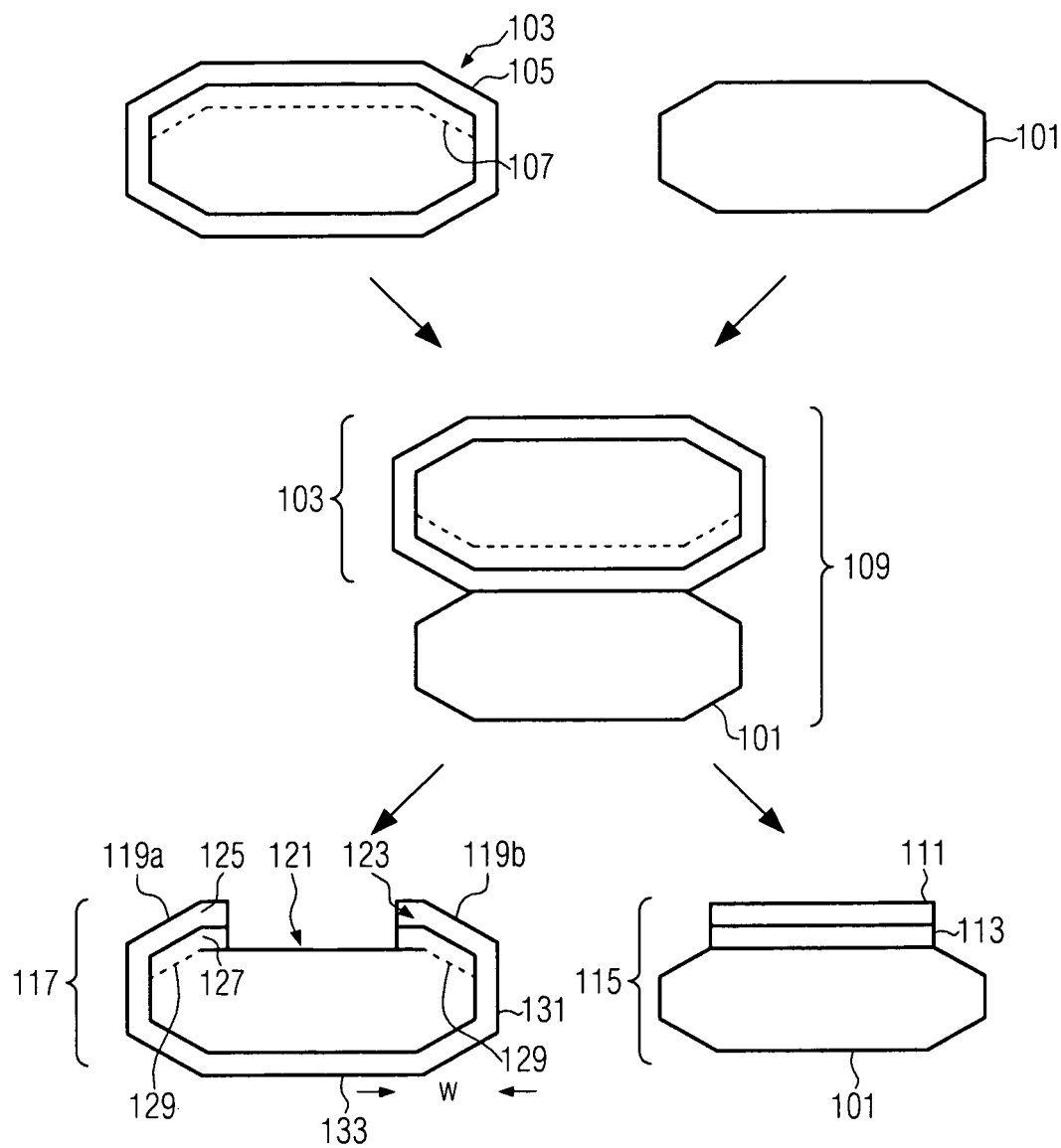
FIG. 1 illustrates the Smart Cut™ process of the prior art.
Figure 2A:
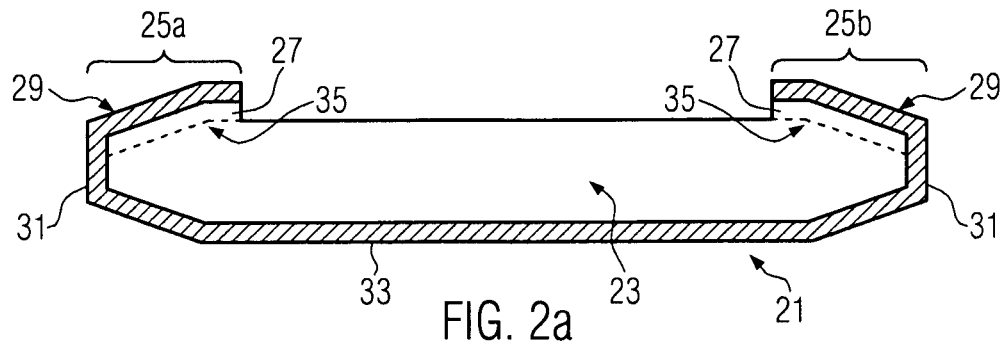
FIGS. 2a-2e illustrate a first embodiment according to the invention, wherein the oxide layer of the remainder is used as a physical mask.

For purposes of illustration, and not limitation, FIGS. 2a-2e illustrate a first embodiment of the invention, wherein the oxide layer of the remainder is used as a physical mask. FIG. 2a illustrates schematically a remainder 21 of a donor substrate which has been used in a layer transfer process like, for example, the Smart Cut™ process described above in relation to FIG. 1. The remainder 21 illustrated in FIG. 2a corresponds to the negative 117 illustrated in FIG. 1.

The reminder 21 comprises a base layer 23, which may be made of, for example, silicon or germanium. The surface in the edge region of the base layer 23 carries a protruding topography 25a and 25b. As was the case with the structure shown in FIG. 1, this protruding residual topography 25a, 25b is the result of non-transferred parts due to the edge geometry of the wafers comprising a chamfered region. The protruding topography in this embodiment comprises a step-like residual first layer 27, such as silicon or germanium, and a second layer 29, such as a silicon oxide or a germanium oxide. The second layer also extends over the side edge 31 of the base 23 and the backside surface 33, opposite to the side with the protruding residual topography 25a, 25b. Finally, a predetermined splitting area 35, formed by implanted ions, is still present between the base 23 and the first layer 27 of the protruding topography 25a, 25b.

Figure 2B:
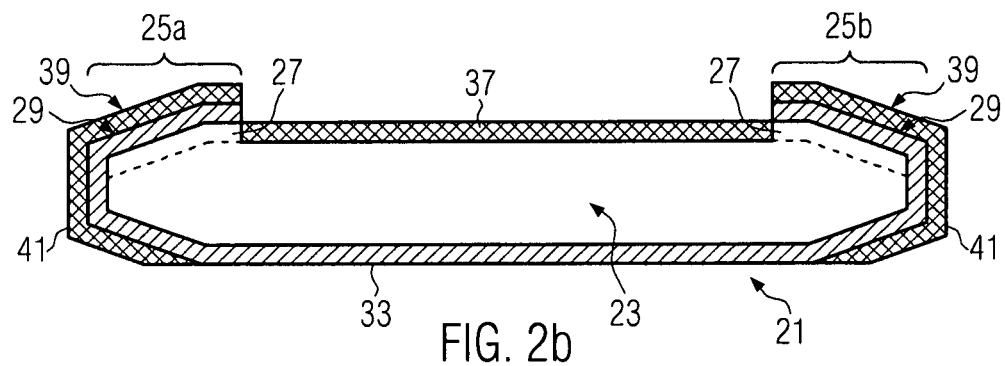

As a next step, illustrated in FIG. 2b, the method for reclaiming the surface of substrate 21 comprises providing a filling material layer 37 on the surface of base 23 between the protruding portions 25a, 25b but also on the protruding portions 25a, 25b as well as on the side of base 23. In this embodiment, the filling material is, however, not provided on the backside 33 of base 23.

For a silicon base 23 and for a silicon oxide second layer 29, the filling material used is silicon. It can be deposited using a chemical vapor deposition (CVD) process based on silicon precursors such as silanes ($SiH_4$, $Si_2H_6$, . . . ). The filling material layer 37 will be removed together with the protruding first layer 27 later during the process, so that there is no need to provide an epitaxial growth. To speed up the reclaiming process compared to a monocrystalline or epitaxial deposition process, the CVD process is carried out such that an amorphous or polycrystalline layer is deposited.

The nature of the filling material 37 is chosen such that its polishing properties correspond to the properties of the first material. This is in particular the case when the filling material and the first material are of the same chemical nature. In this context, polishing of the filling material and the protruding residual topography 25a and 25b occur substantially at the same removal rate. Thus, the planarity of the surface after polishing enables a wafer bonding to be carried out. A touch-polish or a mirror-polish may also be used to further reduce the roughness.

In this embodiment, the thickness of the polysilicon material layer 37 essentially corresponds to the thickness of the step-forming first layer 27. The thickness of layer 37 should at least represent 50% and at most 150% of the first layer 27 so that the advantages of the method, as described later on, can be achieved.

Figure 2C:
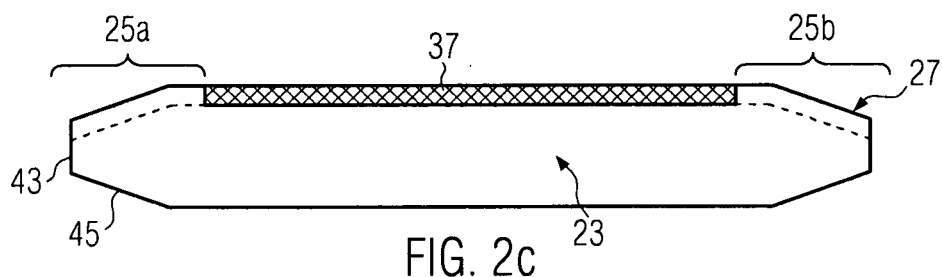

FIG. 2c illustrates the result of the subsequent process step which involves removing the second layer 29 on the protruding topography, on the side 31 and on the backside 33. This leads, at the same time, to the removal of the filling material layer portions 39, 41 provided on the second layer in the first and second protruding topography region 25a and 25b as well as on the side 31 of the base 23.

The removal of the second layer can be achieved by a de-oxidation step, when the second layer is silicon oxide. An HF bath can be used to remove the oxide. The HF bath leads to the consumption of the oxide layer 29, 31, and 33 and also creates a lift-off effect with regard to the filling material, here the polysilicon, deposited on the protruding topography 25a and 25b and on the side. The part of the filling material layer 37 positioned directly on the base 23 is however, not affected by the HF bath and remains in place.

As mentioned above, the filling material layer has not been provided on the backside 33 of substrate 21 so that the HF solution can effectively attack the oxide of the second layer 29. Instead of attacking the oxide via the backside, it is of course also possible to let the acid attack via the side, in which case it has to be ensured that at least a part of the side of the substrate has the oxide of the second layer on the surface After the lift-off, the base 23, the first layer 27 of the protruding topography, and the polysilicon filling material layer 37 positioned between the protruding portions 25a, 25b remain as shown in FIG. 2c.

Figure 2D:
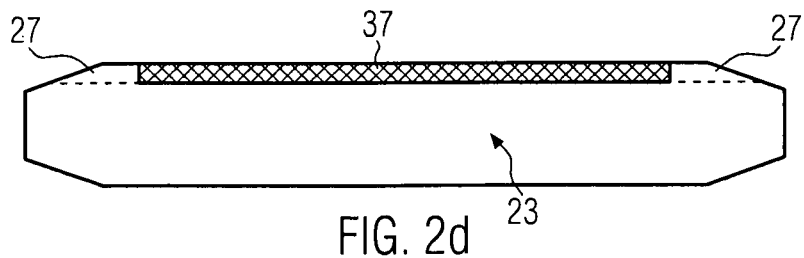

As a next step, an edge polishing, as used in the prior art, is carried out to remove, at least partially, the stepped first layer 27 of the protruding topography 25a, 25b. During this step, some material is also removed from the lateral edge 43 and on the chamfered portion 45 on the backside. The structure obtained after edge polishing is illustrated in FIG. 2d.

Figure 2E:
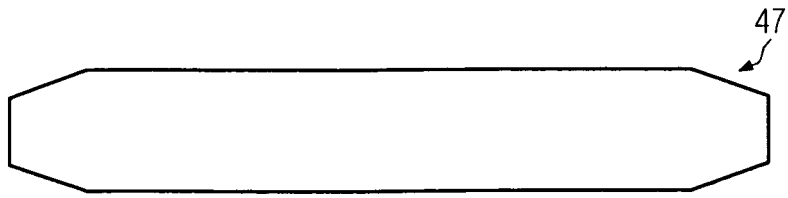

Next a polishing step, preferably a chemical mechanical polishing (CMP) step is applied to remove layer 37 together with the remaining first layer 27 to obtain a reclaimed donor substrate 47 as illustrated in FIG. 2e. The reclaimed donor substrate is then ready for reuse in a layer transfer process, such as the Smart Cut™ process.

During the polishing step, not only are layer 37 and the remaining part of the stepped first layer 27 removed, but the material removal goes beyond both layers to also remove an area of base 23 which carries defects due to the ion implantation. In total, a layer thickness of about 2000-12000 Å is removed.

The method according to the first embodiment has the advantage that a reclaimed substrate 47 can be achieved which fulfills all the standards for re-use in a semiconductor process, like the Smart Cut™ process. Compared to the prior art, no double-sided polishing is necessary so that less material is removed from base 23. As a consequence, one substrate can be re-used for a much higher number of cycles before it becomes too thin. In addition, the geometry of the substrate, in particular concerning the surface at which bonding will occur, can be kept constant.

FIGS. 3a-3e illustrate a second embodiment of the method for reclaiming a surface of a substrate, wherein the surface, in particular a silicon surface, comprises a protruding residual topography. FIG. 3a again illustrates the substrate 21 to be reclaimed, as illustrated in FIG. 2a, as well as FIG. 1. The description of substrate 21 and its elements will thus not be repeated again in detail, but reference is made to the description of FIG. 2a.

The difference between the first and second embodiments is that the filling material is deposited using a different kind of process. Whereas in the first embodiment a process was chosen during which the filling material 37 was present over the entire substrate 21 except the backside 33, the second embodiment proposes a process wherein the second layer 29, thus the oxide layer, plays a different role. In the second embodiment, the oxide layer 29 is a chemical mask so that during deposition of a filling material 51, again polycrystalline silicon, the deposition only occurs on silicon terminated surfaces, thus directly on base 23 between the protruding areas 25a, 25b.

Figure 3A:
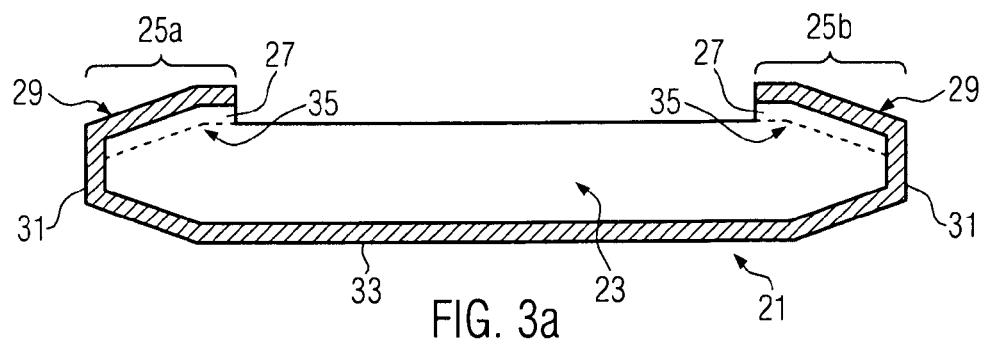
FIGS. 3a-3e illustrate a second embodiment, wherein the oxide layer plays the role of a chemical mask.
Figure 3B:
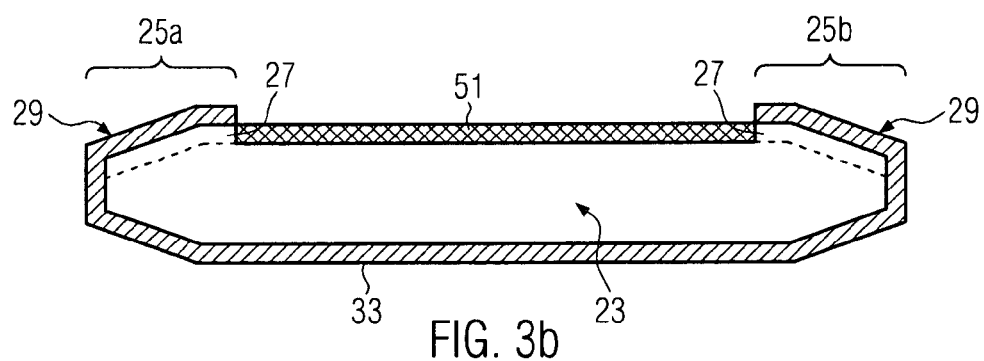

FIG. 3b therefore only illustrates the filling material 51 directly on the base 23. This kind of deposition is achievable using a CVD process based on silicon precursors allowing selective deposition such as dichlorosilane (DCS), $SiHCl_3$, $SiCl_4$.

Figure 3C:
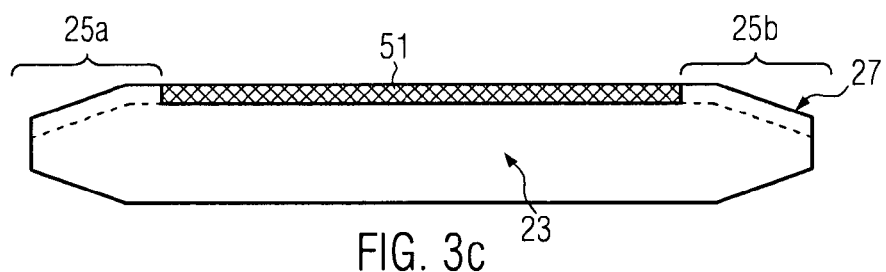
Figure 3D:
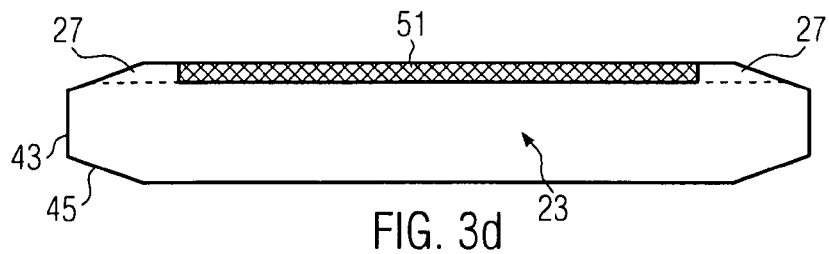

Subsequently, as illustrated in FIG. 3c, the oxide of the second layer 29 in the protruding regions 25a and 25b, as well as on the edge 31 and the backside 33 of the base 23 is removed using an HF bath, as in the first embodiment. The filling material 51 as well as the first layer 27 remain on base 23.

Figure 3E:
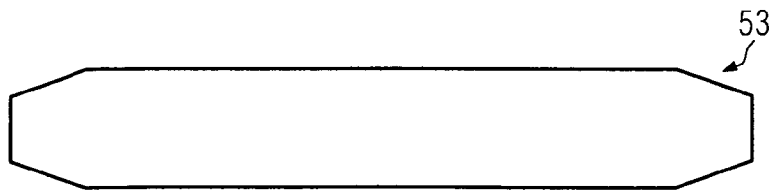

Subsequently, an edge polishing as in the first embodiment is carried out to remove a part of the first layer 27 and to remove material from the lateral edge 43 as well as the backside in the chamfered region 45 of base 23. Finally, a CMP polishing step is carried out to obtain the final reclaimed substrate 53 as illustrated in FIG. 3e. The edge polishing and CMP steps correspond to the corresponding steps of the first embodiment; the description of these steps is therefore incorporated by reference.

Compared to the first embodiment, the second embodiment has the advantage that no lift-off process step needs to be carried out, as the filling material 51 is only deposited directly on the base 23 in the non protruding areas. Thus, during the depositing process, the backside of substrate 21 can be exposed to the precursors, as no deposition will occur on the oxide present on the backside. Thus, a batch-type process can be used in which a plurality of substrates can be treated at the same time. By contrast, in the first embodiment, the backside needs to be protected to remain free of the deposited layer. The necessary masking of the backside can be realized using a single wafer processing tool, in which the substrate is positioned on a substrate holder.

While the second embodiment has the same advantages compared to the first one, namely that no double-sided polishing with its material removal of at least 10 μm can be replaced by a simple chemical mechanical polishing so that less material is removed during reclaiming (only up to about the second embodiment has the additional advantage of increasing the throughput, as the wafers can be recycled in a batch-type process.

In FIGS. 1 to 3, the edge region is not illustrated true to scale compared to the entire substrate 21, 101, 103. For illustrative purposes and to show the impact of the geometry of the edge leading to non transferred regions, the chamfered regions is represented in an exaggerated way.

The invention is not limited to the embodiments described above as the method can be carried out in accordance with other variants. It is intended that the disclosed embodiments include modifications and variations that are within the scope of the appended claims and their equivalents.

The invention claimed is:

1. A method for reclaiming a surface of a substrate, wherein a surface comprises a protruding residual topography resulting from a layer transfer process, wherein the substrate comprises at least a layer of a first material, the method comprising the steps of:
   a) providing a silicon filling material only in the non-protruding areas of the surface of the substrate, and
   b) polishing the surface, wherein the filling material and the protruding residual topography are polished simultaneously during polishing step b), and
the protruding residual topography is completely removed during polishing step b).

2. The method according to claim 1, wherein the first material and the filling material are such that the polishing in step b) occurs substantially at the same removal rate.

3. The method according to claim 1, wherein the first material is in a monocrystalline phase and the filling material in a polycrystalline phase.

4. The method according to claim 1, wherein step b) comprises a chemical mechanical polishing (CMP).

5. The method according to claim 1, wherein the thickness of the layer with the filling material is in a range of 50% to 150% of the thickness of the first material.

6. The method according to claim 1, wherein the thickness of the layer with the filling material is in a range of 80% to 120% of the thickness of the first material.

7. The method according to claim 1, wherein the thickness of the layer with the filling material corresponds to the thickness of the first material.

8. The method according to claim 1, wherein the protruding topography further comprises a second layer of a second material, in particular SiO2, on the first layer and wherein step a) comprises:
   i) depositing, in particular in a reactor using a silicon precursor, the filling material on the second material of the protruding topography and the non-protruding areas, and
   ii) removing the second layer, and at the same time, removing the filling material over the protruding topography.

9. The method according to claim 8, wherein the substrate is arranged such that during step i) the surface side opposite to the surface with the protruding topology remains without a layer of the filling material.

10. The method according to claim 1, wherein the protruding topography comprises a second layer of a second material, in particular SiO2, on the first layer and wherein step a) comprises:
   depositing, in particular in a reactor using a silicon precursor allowing selective deposition, even more in particular dichlorosilane ($SiH_2Cl_2$), the filling material only on the non-protruding areas, using the second layer as a mask.

11. The method according to claim 10, further comprising a step of removing the second layer.

12. The method according to claim 8, wherein step ii) comprises a de-oxidation step using in particular a HF bath.

13. The method according to claim 1, wherein during step b) at least a thickness corresponding to the thickness of the first layer is removed.

14. The method according to claim 13, wherein, during step b), the material removal goes beyond a region with implantation defects.

15. The method according to claim 13, wherein the material removal is in a range of 2000 Å to 12000 Å.

16. The method according to claim 1, further comprising an edge polishing step to remove an ion implanted region in a chamfered edge area of the substrate.

* * * * *